United States Patent [19]

Ono et al.

[11] Patent Number: 5,465,402

[45] Date of Patent: Nov. 7, 1995

[54] AUTOMATIC FREQUENCY TRANSFER AND STORAGE METHOD

[75] Inventors: Akira Ono, Irving, Tex.; Tateo Masaki, Sakura; Hironori Warabi, Mihama, both of Japan

[73] Assignees: Uniden America Corp., Ft. Worth, Tex.; Uniden Corporation, Ichikawa, Japan

[21] Appl. No.: 216,638

[22] Filed: Mar. 23, 1994

[51] Int. Cl.$^6$ .................................................. H04B 1/06
[52] U.S. Cl. .................................. 455/161.2; 455/184.1; 455/186.2
[58] Field of Search ........................... 455/161.2, 168.1, 455/180.1, 180.3, 184.1, 186.1, 186.2; 348/569, 570, 725, 731, 732

[56] References Cited

U.S. PATENT DOCUMENTS

| | | | |
|---|---|---|---|
| 3,965,336 | 6/1976 | Grohmann | 455/169.2 |
| 4,123,713 | 10/1978 | Wine | 455/186.1 |
| 4,218,773 | 8/1980 | Imamura | 455/159.2 |
| 4,236,251 | 11/1980 | Ohgishi et al. | 455/186.1 |
| 4,271,532 | 6/1981 | Wine | 455/186.1 |
| 4,313,213 | 1/1982 | Farina et al. | 455/186.2 |
| 4,355,414 | 10/1982 | Inoue | 455/186.2 |
| 4,355,416 | 10/1982 | Malerba | 455/186.1 |
| 4,509,203 | 4/1985 | Yamada | 455/166.2 |
| 4,521,915 | 6/1985 | Baker et al. | 455/165.1 |
| 4,525,866 | 6/1985 | Templin | 455/186.1 |
| 4,688,261 | 8/1987 | Killoway et al. | 455/76 |
| 4,833,728 | 5/1989 | Kimura et al. | 455/166.2 |
| 4,860,380 | 8/1989 | Mengel | 455/186.2 |
| 4,901,036 | 2/1990 | Herold et al. | 331/25 |
| 4,947,456 | 8/1990 | Atkinson et al. | 455/165.1 |
| 5,014,348 | 5/1991 | Boone et al. | 455/165.1 |
| 5,101,508 | 3/1992 | Owaki | 455/186.2 |
| 5,163,161 | 11/1992 | Bowles et al. | 455/164.1 |

FOREIGN PATENT DOCUMENTS 2073492  2/1992  Japan.

Primary Examiner—Reinhard J. Eisenzopf
Assistant Examiner—Andrew Faile
Attorney, Agent, or Firm—Daniel R. Brown

[57] ABSTRACT

An automatic frequency transfer and storage method is disclosed in a scanning receiver having a channel memory having a plurality of storage locations for storing frequency numbers corresponding to frequencies. In the preferred embodiment, the storage locations are grouped into channel banks. Each storage location is identified with a channel number and each channel bank is identifed with a channel bank identifier. A source channel number and either a destination channel number or destination channel bank identifier are specified. A controller searches the specified channel bank for a clear storage location. In either case, the controller displays the pertinent frequency transfer information and the transfer is executed upon confirmation, and the source storage location is cleared.

11 Claims, 4 Drawing Sheets

AUTOMATIC FREQUENCY TRANSFER AND STORAGE METHOD

TECHNICAL FIELD OF THE INVENTION

This invention pertains to radio receivers having frequency channel memories, and more particularly to scanning receivers having a plurality of channel memories arranged into channel banks and the manipulation of information within the channel memory.

BACKGROUND OF THE INVENTION

Modern scanning receivers typically comprise a wide band receiver with phase lock loop frequency synthesis and a microcontroller having a memory. Various operational controls and data are entered using a key matrix keypad and conventional controls, such as an audio volume potentiometer and squelch threshold potentiometer. Also, a display is typically included to display frequency and channel information together with other operational status indicators. The memory is commonly divided into various portions which may include ROM for permanent storage of the executable code embodying the various functions of the receiver, RAM for storage of temporary variable and such, and, EEPROM for non-volatile storage of user programmed information such as frequency and channel information, and power-on configuration information.

The portion of memory used to store frequency information is commonly referred to as a channel memory because each of a plurality of storage locations stores a number corresponding to a unique frequency, and this frequency is referenced as a channel. The reason for the correspondence of a particular storage location or channel to a programmed frequency is to simplify the memorization of what kinds of radio communications are available by recalling the number corresponding to a particular frequency from a particular channel memory storage location. For example, a user may have programmed a frequency, 110.000 megahertz in the aircraft band, into channel one in the channel memory in a receiver. Thereafter, when the user desires to listen to the aircraft band, all the he need do is recall channel one. Actually, to store 110.000 megahertz in the channel memory, the microcontroller would have stored a frequency divisor at channel memory storage location one. When memory location one, (channel one), is subsequently recalled, the microcontroller recalls the divisor stored therein and loads the divisor into a phase lock loop synthesizer where it is used to generate a beat frequency, in a first local oscillator, needed to receive the desired frequency of 110.000 megahertz.

The foregoing example recited just one frequency, however most radio services comprise a large number of frequencies. For example, the aircraft band comprises all the frequencies from approximately 108 megahertz to 137 megahertz. In any particular geographic area, several of these frequencies will likely carry intermittent signals. Therefore, it is common for the user to group a plurality of channels together in the channel memory so that they can be scanned by the receiver, increasing the probability that the receiver will receive an active signal frequency in the particular frequency band of interest to the user. Additionally, a particular user may be interested in several different service bands, such as police, emergency medical, fire, government, and etc.

Scanning receivers arrange the channel memory into banks of storage locations, or channels. This is done so that the user can activate one or more channels banks at the time scanning is initiated. Particular banks may be activated based on what kinds of radio services are programmed therein, or, how many channels can be effectively scanned at one time.

The process of programming the channel memory is time consuming and prone to errors and confusion. Upon discovering or learning of a particular frequency of interest, the user selects a channel memory storage location, or channel, and enters the desired frequency in megahertz. For example, the frequency 110.265 megahertz is entered by keying in the digits "1", "1", "0", ".", "2", "6", "5", and then entering the frequency with another key stroke. Each new frequency is entered in turn until all of the frequencies of interest have been stored. If the user is interested in several different radio service bands, each frequency for each service must be entered.

The scanning receiver scans a contiguous group of channels or channel banks. Therefore, it is necessary to program the channels in such a sequence as to allow the desired group of frequencies to be scanned as a contiguous group of channels. Since the various frequencies are sometimes discovered or learned over a long period of time, or, new frequencies become active from time to time, it is often necessary for the user to rearrange the channels in order to keep certain desired groups of frequencies together in a contiguous block of channels. This process involves numerous keystrokes and is prone to error. Also, it is possible for the user to inadvertently overwrite a desired frequency in the channel memory while moving another frequency into a new channel location.

It is therefore necessary and desirable to invent a method wherein the foregoing problems are solved and the management of a plurality of frequencies in a channel memory is simplified and the number of keystrokes required to affect the desired changes is minimized. Furthermore, the management of banks of channels and full versus clear storage locations needs to be improved and simplified.

SUMMARY OF THE INVENTION

A method of automatically transferring numbers, representative of frequencies, in a channel memory of a scanning receiver is disclosed. The channel memory in the preferred embodiment comprises a plurality of storage locations which are grouped into channels banks. The method allows for the transfer of frequency numbers from a particular storage location to another particular storage location, (channel to channel transfer), or from a particular storage location to a clear storage location in a particular channel bank, (channel to channel bank transfer), wherein a microcontroller, (a controller), selects a clear storage location in which to store the transferred frequency number.

Channel to channel transfer is accomplished by specifying the source and destination channel numbers which specify a source and destination channel memory storage location. Specification can be accomplished by directly entering the channel numbers or sequentially selecting the channel numbers by incrementing or decrementing the value of a channel number display and then pressing a key to acknowledge the selection. After the source and destination channel numbers are entered, a controller in the scanning receiver alternately displays, on a display, the source and destination channel numbers together with the source and destination frequencies corresponding to the source and destination frequencies numbers stored in the specified source and destination channel memory storage locations. This step allows the user to verify the transfer information so as to avoid an error in the transfer and a possible loss of information in the specified destination channel memory storage location by unintentionally overwriting the original frequency number therein. Finally, the user executes the transfer by pressing a key on the scanning receiver and the contents of the source storage location is transferred to the destination storage location and the source destination is cleared to contain only zeros in every bit position, by the controller. Obviously, numerous different bit patterns could be designated as indicating a clear storage location. For example, all ones, in every bit position could be used to designate a clear storage location.

Channel to channel bank transfer is accomplished by specifying a source channel number, which specifies a source channel memory storage location, and by specifying a destination channel bank. A specific storage location within the channel bank is not specified by the user. The source channel number is specified in the same manner as described above. The destination channel bank is specified by pressing a key on the keypad of the scanning receiver which identifies the destination channel bank. Alternatively, a plurality of keystrokes could be used to select the destination channel bank, such as scrolling through a list of channel banks, for example. Upon entering the foregoing information, the controller in the scanning receiver searches the destination channel bank for a clear storage location. In the preferred embodiment, a clear storage location is one which is filled with zeros in every bit position. If the search does not yield a clear storage location, then the controller displays "FULL" on a display. Otherwise, if a clear storage location is found, the controller displays the source channel and frequency together with the destination channel bank and clear channel number. This step allows the user to check the transfer details for any errors and the transfer can be canceled if incorrect. If the transfer is as desired, then the user executes the transfer by activating a key on the keypad of the receiver. The contents of the source channel memory storage location is transferred to the destination channel memory storage location in the specified destination channel bank, and, the contents of the source storage location is cleared to zeros.

Using either the channel to channel method, or the channel to channel bank method, the process of organizing frequencies into the channel memory is simplified and the chances for errors reduced. Frequencies can be organized so that scanning a desired group of frequencies can occur by simply specifying a channel bank, and, undesired frequencies will not be scanned because those frequencies have been transferred to other appropriate groupings. Furthermore, frequencies can be ordered to optimize scanning efficiency by placing channels in an optimum order, such as an ascending numerical order, that minimizes the frequency step slew time for the frequency synthesizer. Also, channels can be ordered for convenience when the user is manually stepping through channels.

BRIEF DESCRIPTION OF THE DRAWINGS

The features of the present invention which are believed to be novel are set forth with particularity in the appended claims. The invention, together with further objects and advantages thereof, may be best understood by making reference to the following description taken in conjunction with the accompanying drawings, in the several figures of which like reference numerals identify identical elements, and wherein:

DETAILED DESCRIPTION

The present invention is embodied in a broad band scanning receiver. The various steps claimed are executed either by object code software commands, under control of a microcontroller, described later, or by user input commands to the scanning receiver.

Figure 1:
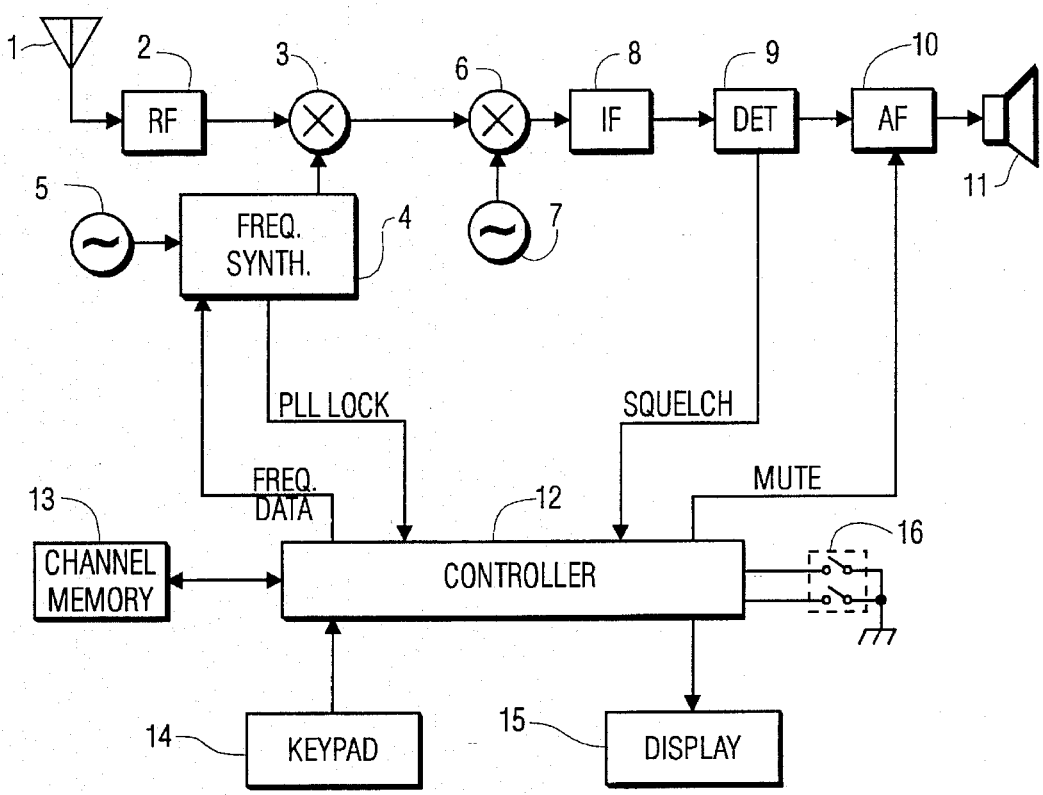
FIG. 1 is an electrical block diagram of a scanning receiver in the preferred embodiment of the present invention.

Reference is directed to FIG. 1 which is an electrical block diagram of the scanning receiver, or scanner, in the preferred embodiment. The scanner comprises an RF circuit 2 which receives a broad band of RF waves comprising a plurality of RF signals, from time to time, as received by antenna 1. The output of RF circuit 2 is coupled to a first mixer 3. First mixer 3 mixes the signals output from RF circuit 2 with a first local oscillator signal coupled from the output of a frequency synthesizer circuit 4. Frequency synthesizer 4 receives a reference frequency signal from reference oscillator 5. The reference frequency is used to produce the first local oscillator frequency to the first mixer 3 for receiving a desired frequency.

A FREQ. DATA signal is input to the frequency synthesizer 4 from controller 12, and this signal provides a number which is a divisor for a divide by counter (not shown) in frequency synthesizer 4. Varying the quantity of this number causes the frequency synthesizer 4 to vary the frequency of the first local oscillator signal coupled to mixer 3. As such, entering a number into the frequency synthesizer 4 determines the frequency of the signal coupled to mixer 3, and thereby controls the frequency of reception of the entire receiver. At the time the number is output from controller 12 to frequency synthesizer 4, a phase comparator within the frequency synthesizer 4 indicates an out of phase condition, or out of lock condition to controller 12 via the PLL LOCK signal. The frequency synthesizer 4 slews a voltage controlled oscillator (not shown) to the correct frequency after a brief period of time. As this occurs, the phase comparator indicates the lock up condition to the controller 12 via the PLL LOCK signal. Such frequency synthesizer designs are well known in the art.

The output of frequency synthesizer 4 mixes with the output of RF circuit 2 in first mixer 3 to produce a first intermediate frequency at the output of mixer 3. The first intermediate frequency is coupled to the input of second mixer 6. A second local oscillator 7 feeds a second local oscillator frequency into mixer 6 and the first intermediate frequency and second oscillator frequency mix in mixer 6 to produce a second intermediate frequency which is coupled to the input of intermediate frequency circuit 8. The output of intermediate frequency circuit 8 is coupled to the input of detector circuit 9 which produces an audio frequency output that is further coupled to audio frequency circuit 10. Detector circuit 9 also produces a squelch output signal which indicates the presence of an active signal, SQUELCH, to controller 12. Squelch signals are commonly used in the art for various types of receivers including amplitude modulated signal receivers and frequency modulated signals receivers. It is common for the threshold level of the squelch signal to be adjustable by means of a potentiometer, (not shown), or other similar control. Adjustment of the squelch threshold adjusts the threshold signal strength of an active signal frequency that will be received by the scanner.

Audio frequency circuit 10 amplifies the aforementioned audio signal and drives speaker 11. Audio frequency circuit 10 also receives a muting signal, MUTE, from controller 12 which enables and disables the output of audio circuit 10, thereby enabling and disabling the audio signal reproduced by speaker 11.

Controller 12 may comprise an 8-bit central processing unit together with memory, including RAM, ROM, and EEPROM, and peripheral input/output circuitry. The Hitachi model H8/338 is suitable, for example. In FIG. 1, a separate channel memory 13 is shown, however, the channel memory may be a part of the aforementioned memory circuits comprised within the controller 12. In the preferred embodiment, EEPROM is used because of its non-volatile attribute. Channel memory 13 is shown as a separate entity in FIG. 1 for clarity only.

A keypad 14 is coupled to the controller 12 in the preferred embodiment. The keypad serves as an input device for selecting the source and destination channels and destination channel bank. The keypad is also used to enable the transfer of channel information in the preferred embodiment. The keypad may be of conventional design and include the numeric digits "0" through "9" and a decimal point. Additionally, the keypad 14 comprises keys identified as "A", "B", "C", "D", "E", "SCAN", "MAN", "SEND", "HOLD", AND "ENTER". Frequencies are entered as multiples of one megahertz. For example 153.500 MHz is entered as "1-5-3-.-5-0-0. Frequencies are converted by controller 12 into numbers which are used a divisors for the PLL unit 4, as described herein before. The keypad is also used to select banks of storage locations within the channel memory 13. In the preferred embodiment, there are five banks of ten storage locations and the banks are identified by the letters "A" through "E".

A display 15 is coupled to controller 12 for displaying various status information concerning the operation of the scanning receiver. In the preferred embodiment, the display is a custom masked liquid crystal type which comprises six digits of seven-segment display characters plus a decimal point for displaying the frequency information, and, two additional digits of seven-segment display characters for displaying the channel numbers. Also, the display comprises icons for the letters "A" through "E" for displaying the selection of the channel memory banks. The aforementioned seven-segment digits are also used to display simple words including "FULL" and "END". Also, icons for the "SCAN" and "MAN" (manual) functions are provided on display 15. Such displays are well known in the art.

"UP" and "DOWN" switches 16 are coupled to controller 12 for incrementing and decrementing either the channel number or frequency on the display 15 and for making a selection of such. These switches 16 are accessible from the front panel of the receiver as "up" and "DOWN" buttons, or alternatively, as a rotary knob.

Figure 2:
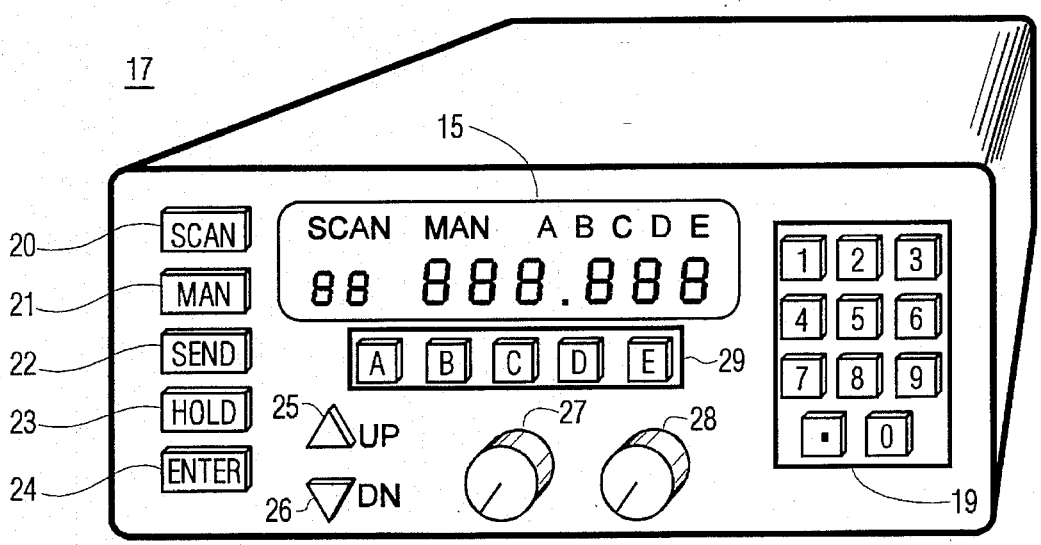
FIG. 2 is a drawing of the scanning receiver in the preferred embodiment.

Reference is directed to FIG. 2 which is a drawing of the scanning receiver in the preferred embodiment. The scanning receiver 17 has a user interface comprising several controls and indicators. The controls include a numeric keypad 19 comprising the digits "0" through "9" and a decimal point. The numeric keypad is used to enter channel numbers and frequencies in the preferred embodiment. A channel bank select keypad 29 is included for selecting one of five channel banks, ("A" through "E") in the preferred embodiment. Several function selecting keys are also included comprising "SCAN" 20, "MAN" 21. "S END" 22, "HOLD" 23, and "ENTER" 24 . The "SCAN" 20 key is used to enable a scanning function in the receiver. The "MAN" 21 key is used to enable an manual received mode of operation in the receiver wherein channels are manually selected for reception. The "SEND" 22 key is used to enable the transfer of frequency numbers stored in storage locations in the channel memory from a source storage location to either a destination storage location or a destination channel bank The "HOLD" 23 key is used to hold the transfer of a frequency number while the transfer information is reviewed by the user. The "ENTER" 24 key is used to execute a transfer after it has been enabled and reviewed by the user.

"UP" 25 and "DOWN" 26 buttons are provided for incrementally stepping up or down through the available channels or frequencies. A volume adjustment knob 27 is provided for adjusting the gain of audio frequency circuit 10. A squelch threshold adjustment knob 28 is provided to set the threshold signal level required by the detector circuit 9 to activate the SQUELCH signal to controller 12.

A display 15 is provided on the receiver 17 for displaying the various channel, frequency, and status information described herein.

Figure 3:
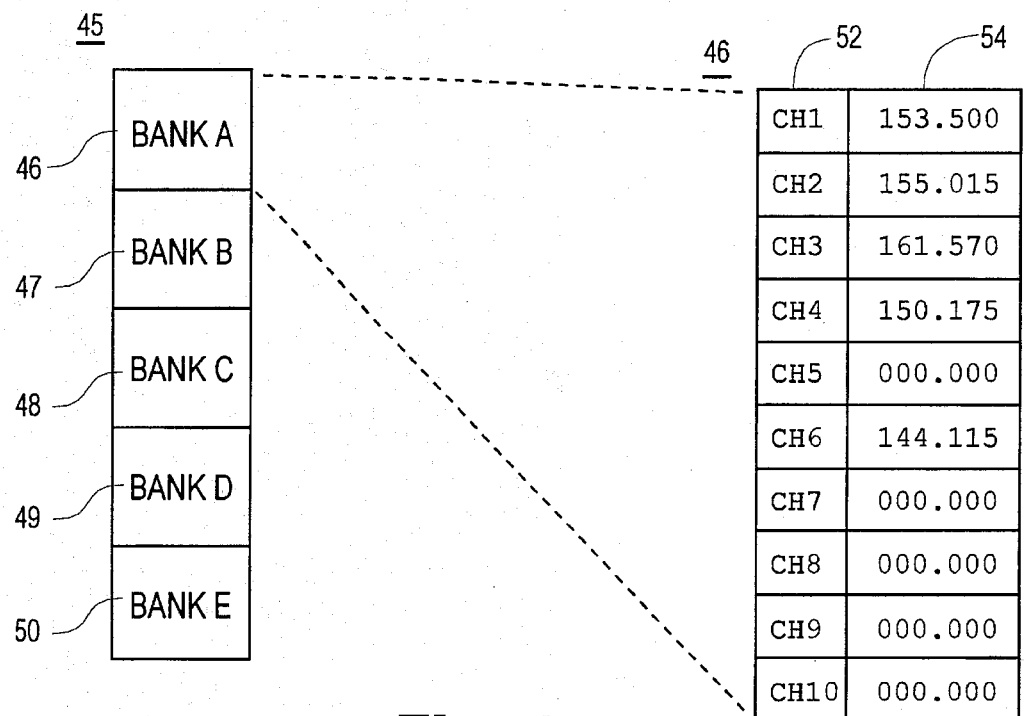
FIG. 3 is memory diagram of channel banks in the preferred embodiment.

Reference is directed to FIG. 3 which is a memory map of the channel memory in the preferred embodiment. The channel memory 45 comprises a plurality of channel banks, BANK A 46, BANK B 47, BANK C 48, BANK D 49, AND BANK E 50. Each bank comprises a plurality of storage locations identified by channel numbers and for storing frequency numbers. FIG. 3 details the structure of BANK A 46 which comprises a plurality of storage locations 54 identified by channel numbers 52 including channels one through ten. It is to be understood that each storage locations stores a frequency number used as a divisor in the frequency synthesizer 4. However, for the drawings, the frequencies represented by the frequency numbers are shown, for the sake of clarity.

Each of the channel banks comprised a plurality of storage locations identified by channels numbers. In the preferred embodiment, there are ten channels per channel bank, so BANK B comprises channels eleven through twenty, and so on to BANK E which comprises channels forty-one through fifty.

Figure 4:
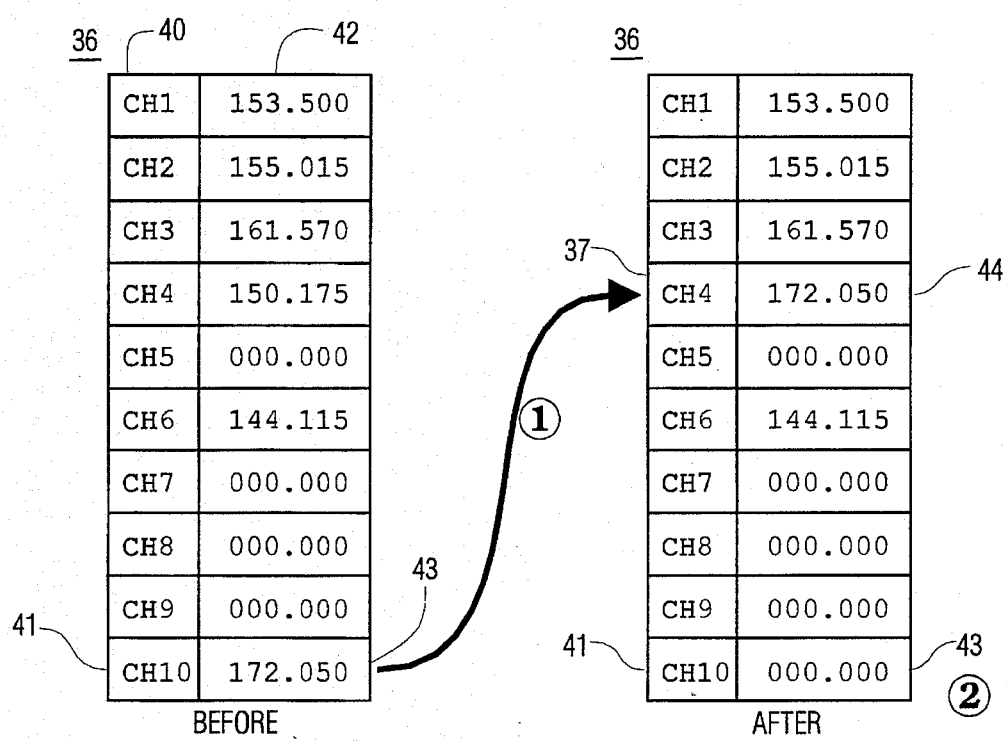
FIG. 4 is a diagram of an example channel to channel transfer in the preferred embodiment.

Reference is directed to FIG. 4 which is a diagram of an example channel to channel transfer in the preferred embodiment. Channel BANK A 36 is shown in a "BEFORE" and "AFTER" condition. Channel BANK A comprises a plurality of frequencies 42 identified by a plurality of channel numbers 40. In this example, CH10 41 containing the frequency 172.050 MHz 43 is specified as the source channel and CH4 37 is specified as the destination channel for the transfer identified by the arrow at step ①. Upon execution of the specified transfer, the contents of CH10 41, which was 172.050 MHz is written to CH4 37 and any contents previously therein are overwritten and lost. In the AFTER condition, it can be seen that CH4 37 now contains the frequency 172.050 MHz 44. Upon completing the transfer, the contents of CH10 41 is cleared to zeros 43 as indicated by step ②. Thus, the desired transfer is accomplished. It is to be understood that any channel in the channel memory may be specified as either the source or destination channel.

Figure 5:
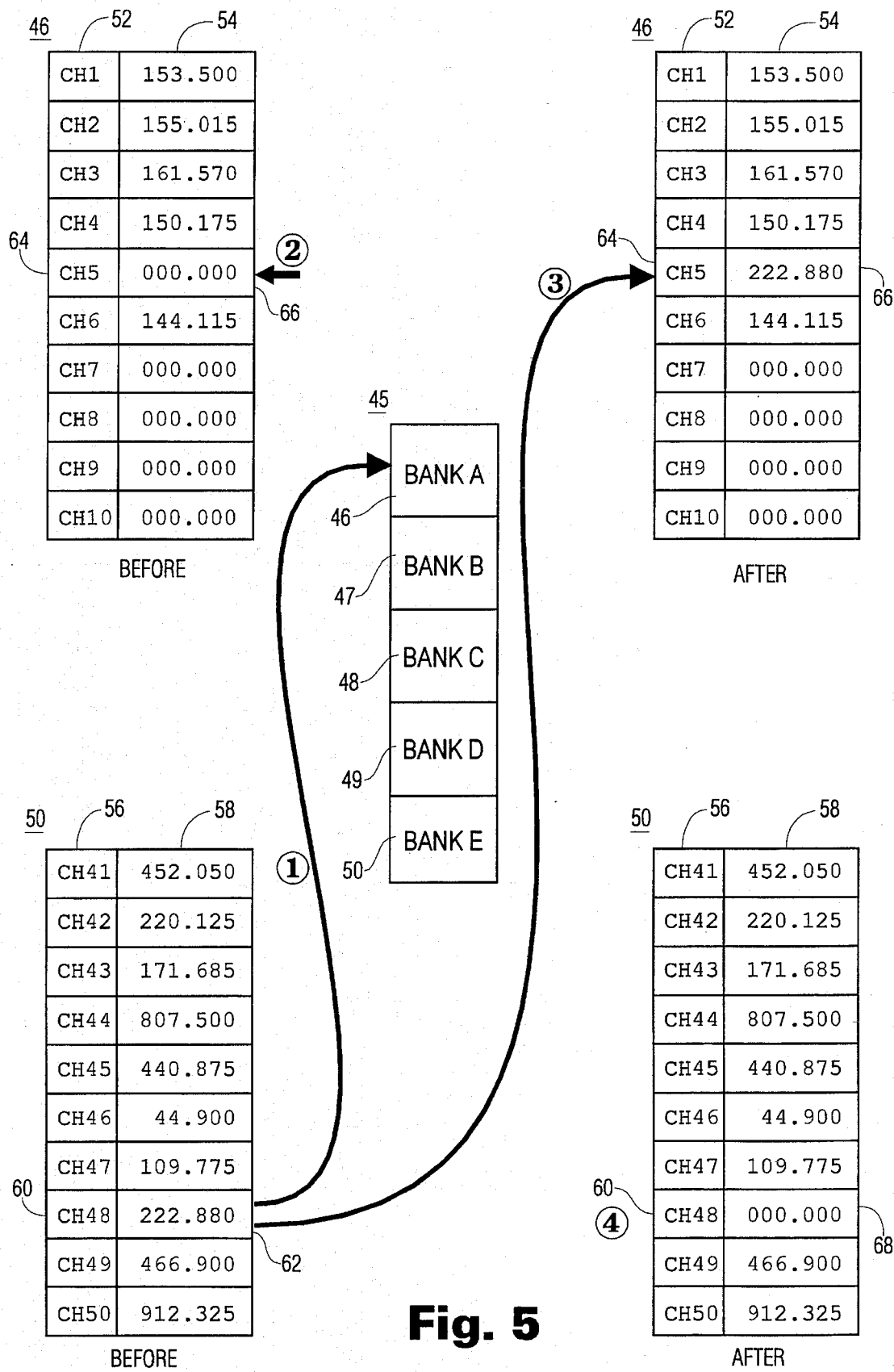
FIG. 5 is a diagram of an example channel to channel bank transfer in the preferred embodiment.

Reference is directed to FIG. 5 which is a diagram of an example of a channel to channel bank transfer in the preferred embodiment. FIG. 5 shows channel BANK A 46 and channel BANK E 50 in a "BEFORE" and AFTER" condition. Additionally, channel memory 45 is shown.

BANK A 46 comprises a plurality of storage locations 54 identified by a plurality of channel numbers 52. Likewise, BANK E 50 comprises a plurality of storage locations 58 identified by a plurality of channel numbers 56. In this example, the user specifies CH48 60 as the source channel and BANK A 46 in channel memory 45 as the destination channel bank during the step identified by arrow ①.

The controller subsequently searches the destination BANK A 46 for a clear storage locations. At step ②, the controller finds that CH5 64 is clear by virtue of the fact that it is filled with zeros 66. The controller then displays the transfer information identified by arrow ③, wherein the contents of CH48 60 which is 222.880 MHz 62 will be transferred to CH5 64. Upon execution of the transfer, the frequency 222.880 MHz 66 is written to CH5 64 and the contents of CH48 60 is cleared to zeros 68 at step ④.

Figure 6:
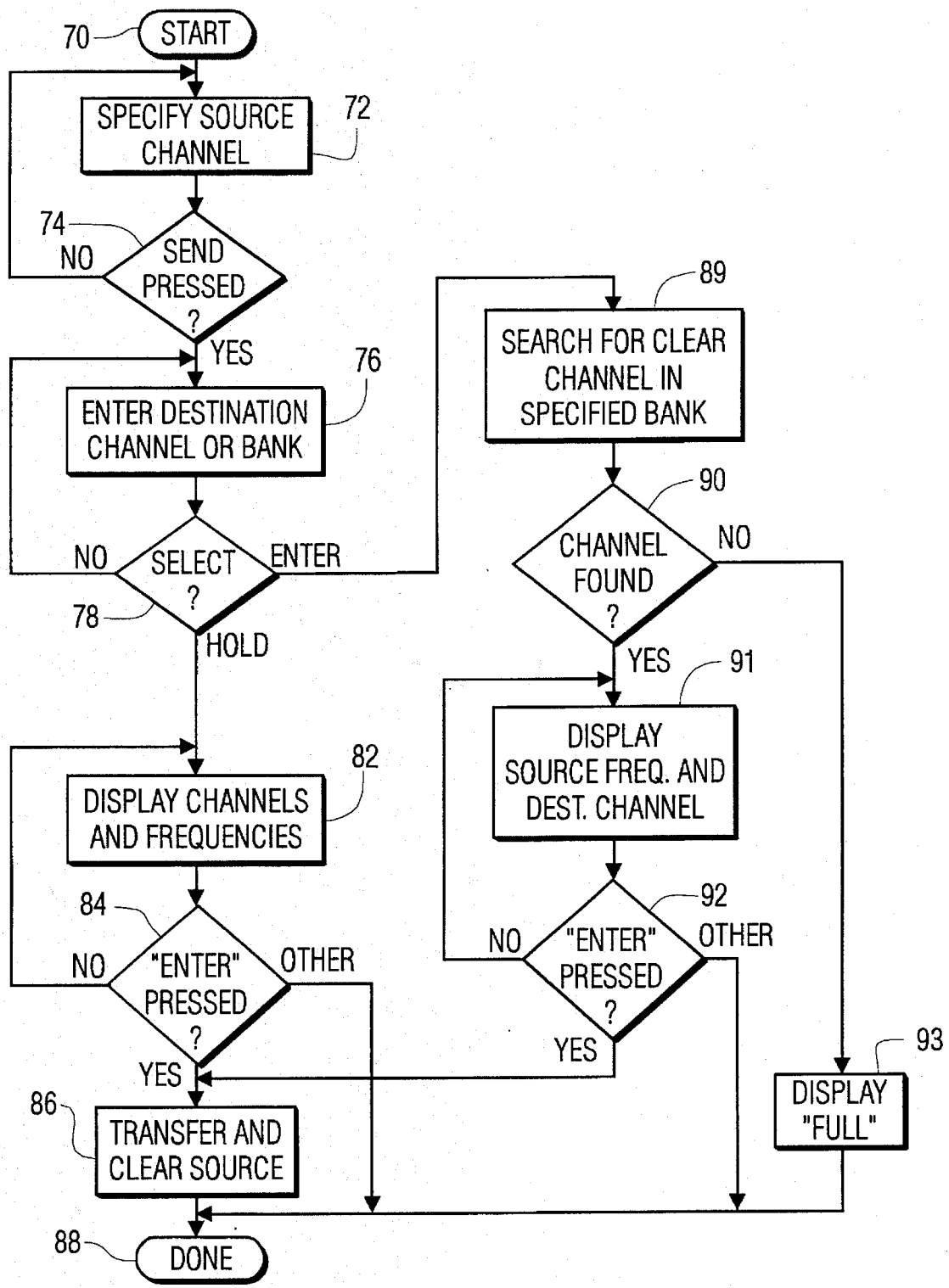
FIG. 6 is a flow diagram of the transfer method in the preferred embodiment.

Reference is directed to FIG. 6 which is a flow diagram of the preferred embodiment. The channel transfer method is started from step 70 when the user specifies a source channel at step 72. In the preferred embodiment, the source channel may be selected by entering a channel number on the keypad and pressing the "MAN" key. Next, the user presses the "SEND" key at step 74 to enable the transfer method. At step 74, if the use does not press "SEND", the controller returns to step 72 and waits for the entry of another source channel number.

At step 76, the user specifies either a destination channel number, or alternatively a destination channel bank. At step 78, the next action taken by the user determines how the controller interprets the input destination. If the user presses "HOLD", then the controller proceeds to step 82 where the source channel number and source frequency are displayed alternately with the destination channel number and the present destination frequency. The purpose of this step is to allow the user to review this information for accuracy before executing the transfer of information. At step 84, the controller checks for a key press. If no key is pressed, the controller recirculates to step 82 and continues to display the channel and frequency information. If, at step 84 a key other than "ENTER" is pressed, then the transfer is disable and the procedure is terminated at step 88. Otherwise, at step 84, if "ENTER" is pressed, then the transfer is executed at step 86 wherein the contents of the source storage location, defined by the source channel number, is transferred to the destination storage location, defined by the destination channel number, and the contents of the source storage location is cleared.

Returning to step 78, if "ENTER" is pressed, then the destination is interpreted as being a channel bank and the controller proceeds to step 89. At step 89, the controller searches the specified channel bank, one storage location at a time and each in turn, for a location that is clear. At step 90, if a clear location is not found in the specified destination channel bank, the controller proceeds to step 93 where "FULL" is displayed on the display and the method is then terminated at step 88. If, on the other hand, at step 90, a clear storage location is found, the controller displays the source frequency and the destination channel number at step 91. This allows the user to verify the transfer information before executing the transfer.

At step 92, the controller checks for a key press. If no key is pressed, the controller recalculates to step 91 and continues to display the channel and frequency information. If a key other than "ENTER" is pressed at step 92, the transfer is terminated and the controller proceeds to step 88. Otherwise, if "ENTER" is pressed at step 92, the controller proceeds to step 86 where the frequency number stored in the source storage location, as defined by the source channel number, is transferred to the destination storage location found by the controller, and, the contents of the source storage location is cleared.

Finally, the controller proceeds to step 88, where the transfer method is terminated.

While the foregoing specification and drawings enable those skilled in this and related arts to practice the present invention in accordance with the preferred embodiment, the claimed invention encompasses a broader scope. Further modifications and improvements may occur which will make obvious manifold variants of the present invention. The claims appended hereunto are intended to read upon all such variants.

What is claimed is:

1. A method of transferring a frequency identifier in a channel memory in a scanning receiver, the frequency identifier being correlated to a frequency, and, the channel memory comprising a plurality of storage locations for storing a plurality of frequency identifiers, and, the storage locations being identified by a plurality of unique channel numbers, and, the scanning receiver comprising a controller coupled to the channel memory, the method comprising the steps of:

specifying a source channel number that identifies a first storage location;

specifying a destination channel number that identifies a second storage location;

transferring, by the controller, the frequency identifier stored in said first storage location to said second storage location, and subsequently selecting said destination channel number thereby causing said controller to recall the frequency identifier stored in said second storage location and enabling the scanning receiver to receive the frequency correlated to the frequency identifier stored therein.

2. The method of claim 1 wherein the scanning receiver comprises a display, coupled to the controller, further comprising the step of:

displaying on the display, by the controller, the frequencies correlated to the frequency identifiers stored in said first and said second storage locations.

3. The method of claim 1 wherein the scanning receiver comprises a display, coupled to the controller, further comprising the step of:

displaying on the display, by the controller, said source channel number and said destination channel number.

4. The method of claim 1, further comprising the step of:

clearing said first storage location after said transferring step.

5. A method of transferring a frequency identifier in a channel memory in a scanning receiver, the frequency identifier being correlated to a frequency, and, the channel memory comprising a plurality of storage locations for storing a plurality of frequency identifiers, and, the storage locations being identified by unique channel numbers, and, the scanning receiver comprising a controller coupled to the channel memory, and, the scanning receiver further comprising a display coupled to the controller, the method comprising the steps of:

- specifying a source channel number that identifies a first storage location;
- specifying a destination channel number that identifies a second storage location;
- enabling a transfer function wherein the display displays the frequencies correlated to the frequency identifiers stored in said first and said second storage locations, and, further displays said source channels number and said destination channel number;
- executing said transfer function, wherein the controller transfers the frequency identifier stored in said first storage location into said second storage location and clears said first storage location, and
- subsequently selecting said destination channel number thereby causing said controller to recall the frequency identifier stored in said second storage location and enabling the scanning receiver to receive the frequency correlated to the frequency identifier stored therein.

6. A method of transferring a frequency identifier in a channel memory in a scanning receiver, the frequency identifier being correlated to a frequency, and, the channel memory comprising a plurality of channel banks identified by a plurality of channel bank identifier, and, the channel banks comprising a plurality of storage locations for storing a plurality of frequency identifiers, and, the storage locations being identified by a plurality of unique channel numbers, and, the scanning receiver comprising a controller coupled to the channel memory, the method comprising the steps of:

- specifying a source channel number that identifies a source storage location;
- specifying a destination channel bank;
- searching said destination channel bank, by the controller, for a clear storage location identified by a destination channel number;
- transferring, by the controller, the contents of said first storage location to said clear storage location in said destination memory bank, and
- subsequently selecting said destination channel number thereby causing said controller to recall the frequency identifier stored in said clear storage location and enabling the scanning receiver to receive the frequency correlated to the frequency identifier stored therein.

7. The method of claim 6, further comprising the step of: clearing said source storage location after said transferring step.

8. The method of claim 6 wherein the scanning receiver comprises a display, coupled to the controller, further comprising the step of:

- displaying a channel number corresponding to said clear storage location, before said transferring step, by said controller, on said display.

9. The method of claim 6, further comprising the step of:

- upon not finding said clear storage location in said searching step, displaying an indication that said clear storage location has not been found, by the controller, on the display.

10. A method of transferring a frequency identifier in a channel memory in a scanning receiver, the frequency identifier being correlated to a frequency, and, the channel memory comprising a plurality of channel banks identified by a plurality of channel bank identifier, and, the channel banks comprising a plurality of storage locations for storing a plurality of frequency identifiers, and, the storage locations being identified by a plurality of unique channel numbers, and, the scanning receiver comprising a controller coupled to the channel memory, and the scanning receiver comprising a display coupled to the controller, the method comprising the steps of:

- specifying a source channel number that identifies a source storage location;
- specifying a destination channel bank;
- searching said destination channel bank, by the controller, for a clear storage location and displaying a destination channel number identifying said clear storage location on the display;
- transferring the frequency identifier from said first storage location to said clear storage location, and clearing said first storage location by said controller, and
- subsequently selecting said destination channel number thereby causing said controller to recall the frequency identifier stored in said clear storage location and enabling the scanning receiver to receive a the frequency correlated to the frequency identifier stored therein.

11. The method of claim 10, further comprising the step of:

- upon not finding said clear storage location in said searching step, displaying an indication that said clear storage location has not been found, by the controller, on the display.

* * * * *